United States Patent
Morton et al.

(10) Patent No.: US 11,588,218 B1
(45) Date of Patent: Feb. 21, 2023

(54) TRANSVERSELY TAPERED FREQUENCY SELECTIVE LIMITER

(71) Applicant: Raytheon Company, Waltham, MA (US)

(72) Inventors: Matthew A. Morton, Lynnfield, MA (US); Gerhard Sollner, Lincoln, MA (US); Jason D. Adams, Medway, MA (US); Poornima Varadarajan, Westford, MA (US); Evelina Aleksandro Polyzoeva, Medford, MA (US); Thomas M. Hartnett, Nashua, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/399,510

(22) Filed: Aug. 11, 2021

(51) Int. Cl.
*H01P 1/218* (2006.01)
*H01P 1/22* (2006.01)
*H03H 7/01* (2006.01)
*H01P 1/203* (2006.01)
*H01P 1/23* (2006.01)

(52) U.S. Cl.
CPC ............ *H01P 1/227* (2013.01); *H01P 1/2039* (2013.01); *H01P 1/218* (2013.01); *H01P 1/23* (2013.01); *H03H 7/0107* (2013.01)

(58) Field of Classification Search
CPC .......... H01P 1/227; H01P 1/22; H01P 1/2039; H01P 1/23; H01P 1/215; H01P 1/218; H01P 1/217; H01P 1/20; H01P 1/203; H03H 7/38; H03H 7/0107; H03G 11/006; H03G 11/00

USPC ................... 333/17.2, 24.1, 211, 81 A, 81 R
See application file for complete search history.

(56) References Cited

U.S. PATENT DOCUMENTS

| | | |
|---|---|---|
| 4,595,889 A | 6/1986 | Stitzer et al. |
| 4,845,439 A | 7/1989 | Stitzer et al. |
| 4,944,857 A | 7/1990 | Adam |
| 4,970,775 A | 11/1990 | Brown et al. |
| 4,980,657 A | 12/1990 | Stitzer et al. |
| 5,023,573 A | 6/1991 | Adam |
| 5,157,360 A | 10/1992 | McGann et al. |
| 5,170,137 A | 12/1992 | Woermbke et al. |
| 5,185,588 A | 2/1993 | McGann et al. |
| 6,998,929 B1 | 2/2006 | Adam |
| 7,557,672 B1 | 7/2009 | Adam et al. |
| 7,773,033 B2 | 8/2010 | Morton et al. |
| 8,193,973 B2 | 6/2012 | Morton et al. |
| 8,211,356 B1 | 7/2012 | Hartnett et al. |
| 8,724,739 B2 | 5/2014 | Morton et al. |
| 9,154,173 B1 | 10/2015 | Morton et al. |

(Continued)

OTHER PUBLICATIONS

Stitzer et al., "A Multi-Octave Frequency Selective Limiter;" Proceedings of the 1983 IEEE MTT-S International Microwave Symposium Digest; May 31, 1983; 3 Pages.

(Continued)

*Primary Examiner* — Stephen E. Jones
(74) *Attorney, Agent, or Firm* — Daly Crowley Mofford & Durkee, LLP

(57) ABSTRACT

Methods and apparatus for a frequency selective limiter (FSL) having a magnetic material substrate that tapers in thickness and supports a transmission line that has segments and bends. The segments, which differ in width and are substantially parallel to each other, such that each segment traverses the substrate on a constant thickness of the substrate.

20 Claims, 5 Drawing Sheets

(56) References Cited

U.S. PATENT DOCUMENTS

| | | |
|---|---|---|
| 9,231,064 B1 | 1/2016 | Reza et al. |
| 9,300,028 B2 | 3/2016 | Morton et al. |
| 9,577,328 B2 | 2/2017 | Morton et al. |
| 9,711,839 B2 | 7/2017 | Morton et al. |
| 10,461,384 B2 | 10/2019 | Morton et al. |
| 10,608,310 B1 | 3/2020 | Morton et al. |
| 10,707,547 B2 | 7/2020 | Morton et al. |
| 11,024,932 B1 | 6/2021 | Lovseth |
| 2015/0130564 A1 | 5/2015 | Morton et al. |
| 2015/0365063 A1 | 12/2015 | Geiler et al. |
| 2016/0181679 A1 | 6/2016 | Morton et al. |
| 2018/0366803 A1 | 12/2018 | Morton et al. |
| 2019/0393578 A1 | 12/2019 | Morton et al. |

OTHER PUBLICATIONS

PCT International Search Report and Written Opinion dated Jul. 28, 2022 for International Application No. PCT/US2022/027396; 13 Pages.

Green et al., "Threshold Microwave-Field Amplitude for the Unstable Growth of Spin Waves under Oblique Pumping," Journal of Applied Physics vol. 40, No. 172, Jul. 1968; 7 Pages.

U.S. Appl. No. 63/120,927, Dec. 3, 2020, Geiler et al.

TRANSVERSELY TAPERED FREQUENCY SELECTIVE LIMITER

BACKGROUND

As is known in the art, a frequency selective limiter (FSL) is a nonlinear passive device that strongly attenuates radio-frequency (RF) or microwave signals, both of which will be referred to as RF signals in the following, above a predetermined threshold power level, while passing signals below the threshold power level with only modest loss called insertion loss. One feature of the FSL is the frequency selective nature of the high-power limiting: low power signals close in frequency to the limited signals are substantially unaffected (i.e., the FSL only attenuates such signals by the insertion loss).

A typical implementation of an FSL includes a stripline transmission-line structure using two layers of ferrite material, typically yttrium iron garnet (YIG), disposed about the stripline, with the stripline having a fixed length and a fixed width along the length of the FSL, with a constant magnetic field applied to the ferrite. Such structures are relatively simple to fabricate and provide adequate RF magnetic fields in the ferrite to realize a critical power level of approximately 0 decibels relative to one milliwatt dBm) when using a single crystal ferrite. One known method of reducing the threshold power level is to use a lower-impedance stripline at the cost of increasing the insertion loss. An external matching structure can be used to improve the impedance match to external circuits, but this technique reduces the bandwidth and increases the insertion loss of the FSL. Permanent biasing magnets can be mounted to, or near, the FSL structure to produce a bias field. The direction of the DC magnetic field relative to the strongest RF magnetic field is typically either parallel or perpendicular. The strength of the magnetic field within the structure is one factor in determining the operating bandwidth of the limiter.

Conventional FSL devices may include in-plane tapering of the width of the signal conductor using a variety of coplanar and microstrip transmission lines with both parallel and perpendicular biasing. The purpose of tapering is to reduce insertion loss in the regions that are not above their absorption threshold. However, prior art has only tapered the conductor width along the signal propagation direction.

SUMMARY

Embodiments of the disclosure provide methods and apparatus for a transversely tapered microstrip frequency selective limiter (FSL). In embodiments, an FSL includes a taper in thickness of a substrate in a direction perpendicular to transmission lines. Multiple transmission line segments are defined across the wafer, with each line segment having a constant width such that a 50-ohm characteristic impedance, for example, is maintained over its length with a width determined by the YIG thickness. The connections between adjacent transmission lines can be made on an alternate substrate material so that a parallel magnetic bias is maintained in the YIG substrate. This enables a longer frequency selective limiter in a compact YIG area with a simple single-taper substrate. A microstrip approach may provide higher limiting per unit length than known biplanar waveguide approaches, such as that shown in U.S. Pat. No. 10,707,547, which is incorporated herein by reference.

In embodiments, because each line segment has a different substrate thickness, each line segment also has a different width. The input to the FSL uses the widest line on the thickest YIG and connects to narrower adjacent microstrip lines. This provides a tapered FSL while maintaining the microstrip line geometry. In embodiments, a FSL having a tapered substrate can also be provided in stripline.

In some embodiments, the magnetic material of any of the transmission line structures can include a ferrite material. The ferrite material can include one or more of: yttrium iron garnet (YIG), a single crystal (SC) YIG, polycrystalline (PC) YIG, hexagonal ferrite, or a variety of doped YIG materials, as well as calcium vanadium garnet (CVG), lithium ferrite, or nickel zinc ferrite.

In one aspect, a frequency selective limiter (FSL) comprises: a substrate comprising a magnetic material and having opposing first and second surfaces, wherein the substrate tapers from a first thickness to a second thickness which is less than the first thickness; and a transmission line positioned in relation to the first surface of the substrate, wherein the transmission line has segments and bends, wherein the segments are substantially parallel to each other, and wherein each segment traverses the substrate on a constant thickness of the substrate.

A FSL can further include one or more of the following features: a first one of the segments is wider than a second one of the segments, each of the segments has a constant width across the substrate, a first one of the segments having a largest width of the segments traverses the substrate at a location where the thickness of the substrate is greater than for any other segment, a thickness of each adjacent segment decreases as the thickness of the substrate decreases, the substrate comprises an yttrium iron garnet (YIG) material, a non-magnetic substrate to support the bends of the transmission line, the transmission line comprises a microstrip configuration, the transmission line comprises a stripline configuration, different ones of the segments provide different ranges of power attenuation, magnetic field sources to provide a constant bias magnetic field substantially parallel to an RF magnetic field in the magnetic material, and/or magnetic field sources to provide a constant bias magnetic field substantially perpendicular to an RF magnetic field in the magnetic material.

In another aspect, a method for providing a frequency selective limiter (FSL) comprises: employing a substrate comprising a magnetic material and having opposing first and second surfaces, wherein the substrate tapers from a first thickness to a second thickness which is less than the first thickness; and positioning a transmission line in relation to the first surface of the substrate, wherein the transmission line has segments and bends, wherein the segments are substantially parallel to each other, and wherein each segment traverses the substrate on a constant thickness of the substrate.

A method can further include one or more of the following features: a first one of the segments is wider than a second one of the segments, each of the segments has a constant width across the substrate, a first one of the segments having a largest width of the segments traverses the substrate at a location where the thickness of the substrate is greater than for any other segment, a thickness of each adjacent segment decreases as the thickness of the substrate decreases, the substrate comprises an yttrium iron garnet (YIG) material, employing a non-magnetic substrate to support the bends of the transmission line, and/or different ones of the segments provide different ranges of power attenuation.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Figure 1A:
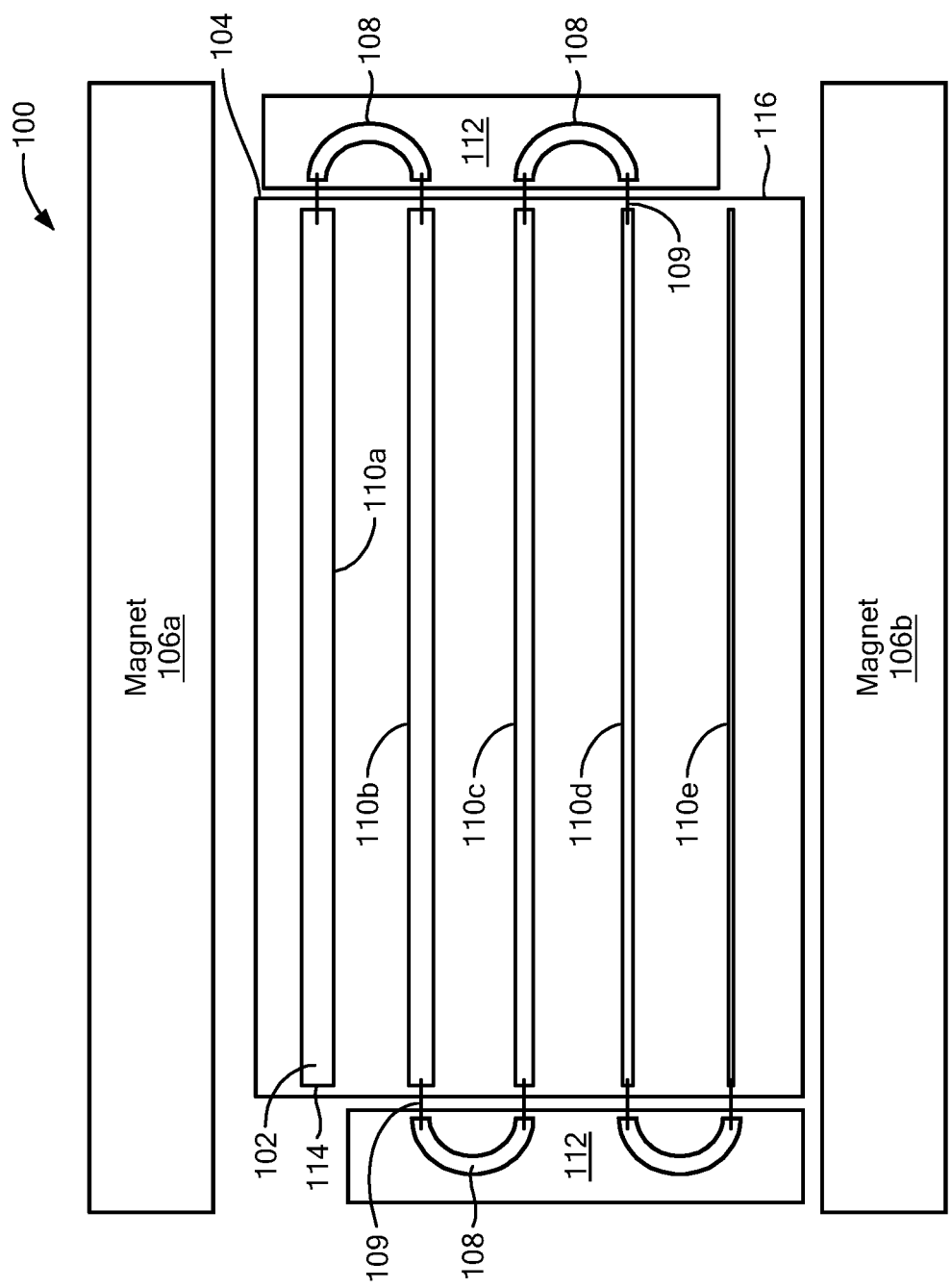
FIG. 1A shows a top view of a transversely tapered microstrip frequency selective limiter (FSL) in accordance with example embodiments of the disclosure.

Example embodiments of a transversely tapered microstrip frequency selective limiter (FSL) includes tapering of the thickness of a substrate, such as a YIG material, in a direction perpendicular to the microstrip lines. Multiple, e.g., five, microstrip lines may be defined across the wafer, with each microstrip line a constant width such that a 50 ohm characteristic impedance, for example, is maintained over its length with the width determined by the YIG thickness. Connections, e.g., bends, between adjacent microstrip line segments are made on an alternate non-magnetic substrate material, so that a parallel magnetic bias is maintained on the YIG material. This enables a longer microstrip frequency selective limiter in a compact YIG area with a simple single-taper substrate.

FIG. 1 shows an example transversely tapered frequency selective limiter (FSL) 100 in accordance with example embodiments of the disclosure. In example embodiments, a transmission line 102, such as a microstrip line, meanders back and forth on a substrate 104, such as YIG, in a parallel bias orientation. In embodiments, magnetic field sources 106a,b, such as magnets and/or coils, are located on opposing sides of the substrate to provide a desired bias field. The transmission line 102 can include a number of bends 108, e.g., 180 degree bends, as the transmission line reverses direction to go back across the substrate 104 (see FIG. 1C). The bends 108 can be connected to the segments with respective conductive bonds 109, such as wire or ribbon bonds. In embodiments, each segment 110a,b,c,d,e of the transmission line has a uniform width across the substrate 104 and a different width than an adjacent segment. In embodiments, the bends 108 in the transmission line overlap with a non-magnetic material 112, such as a ceramic material. A ground plane 105 may support the magnetic substrate 104, and a ground plane 103 may support the non-magnetic substrates 112. The ground planes 103 and 105 may be connected together to form a common ground plane.

Figure 1B:
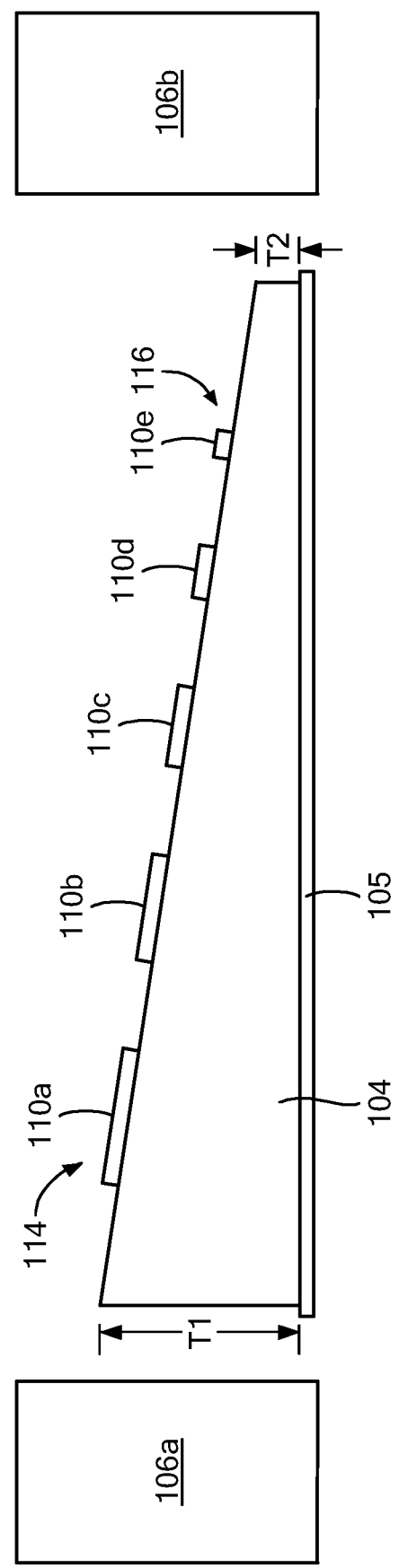
FIG. 1B shows a side view of the transversely tapered microstrip FSL of FIG. 1A in accordance with example embodiments of the disclosure.
Figure 1C:
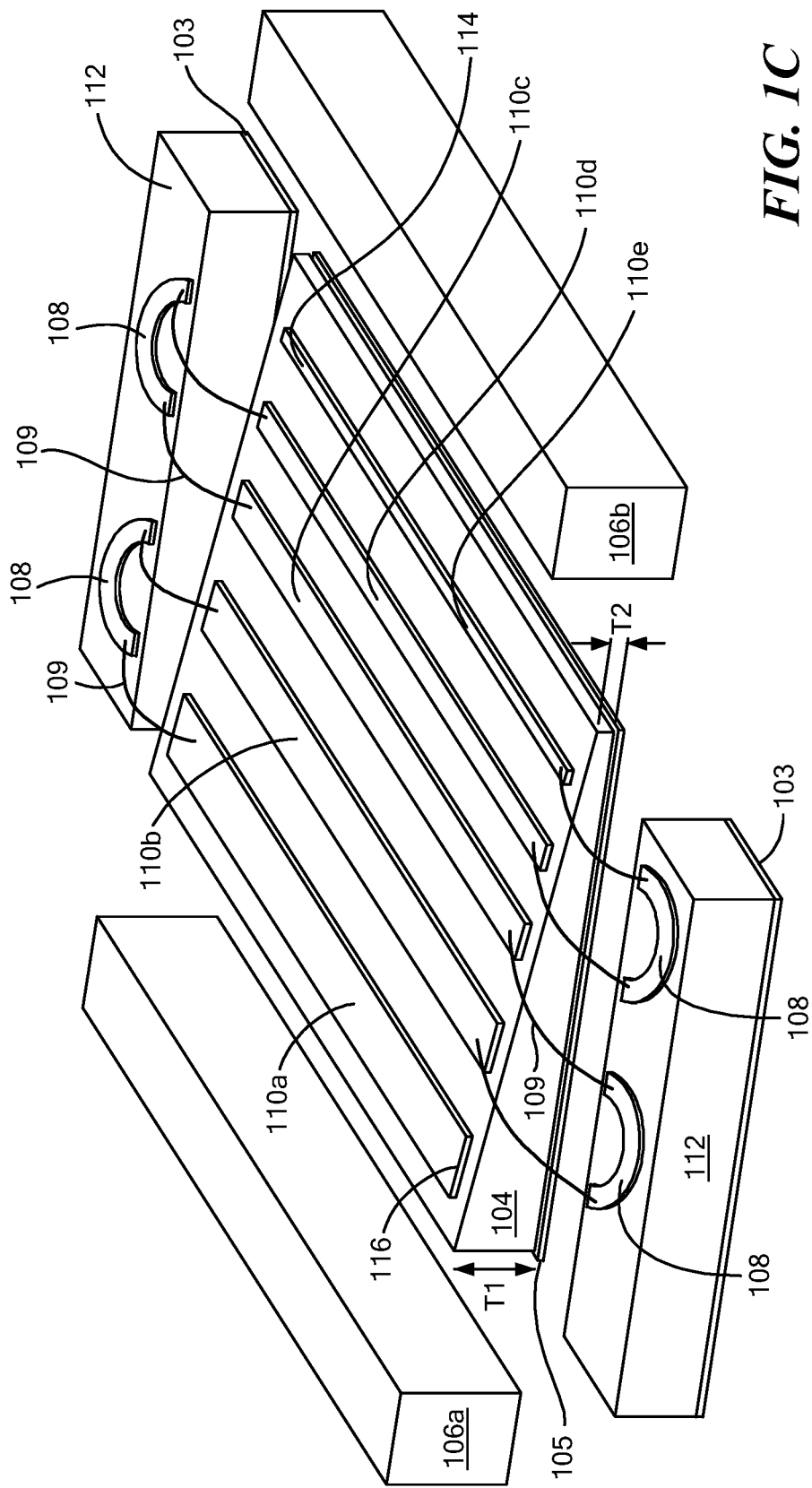
FIG. 1C shows an isometric view of the transversely tapered microstrip FSL of FIG. 1A in accordance with example embodiments of the disclosure.
Figure 1D:
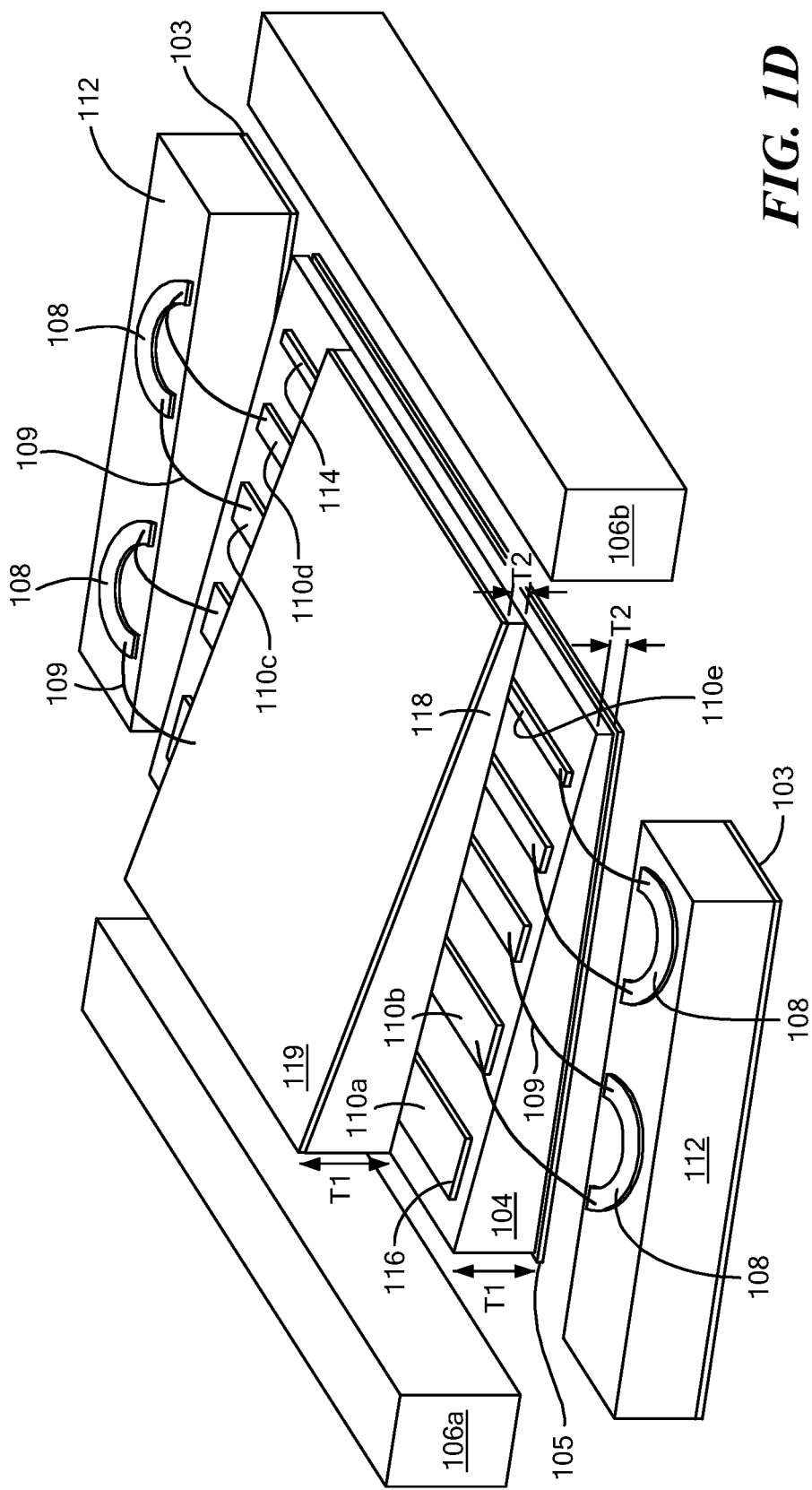
FIG. 1D is an isometric view of a transversely tapered FSL in a stripline configuration in accordance with example embodiments of the disclosure.

In embodiments, as shown in FIG. 1B, which looks into the left side of the top view of FIG. 1A, the substrate 104 tapers from a first thickness T1 to a second thickness T2 in a linear manner. In embodiments, the FSL has an input 114 proximate the first thickness T1 of the substrate 104 and an output 116 proximate the second thickness T2. Each segment 110 of the transmission has a uniform width across the substrate 104 so that the segments see a fixed thickness as the segments traverses the substrate 104. In embodiments, the segments 110 may become narrower in width as the substrate 104 thickness decreases. A ground plane 105 may support the magnetic substrate 104.

In other embodiments, the taper is non-linear, such as stepped, arcuate, ridged, and the like. It is understood that any practical geometry can be used to define a taper of substrate thickness to meet the needs of a particular application.

It is understood that segment widths can vary in relation to the magnetic substrate thickness in any practical configuration to provide attenuation characteristics to meet the needs of a particular application. For example, adjacent segments may be of similar width. FSL embodiments can include a magnetic substrate having a non-linear thickness taper and segments with corresponding widths to provide desired attenuation characteristics.

In other embodiments, a transversely tapered frequency selective limiter (FSL) 100' is provided in a stripline configuration with a YIG superstrate and ground planes connected together. In the example embodiment of FIG. 1D, a magnetic superstrate 118 is located above the transmission line segments 110 that are on top of the magnetic substrate 104. The magnetic superstrate 118 is similarly tapered in thickness across its width in the same manner as magnetic substrate 104. A ground plane 119 may be added on top of the magnetic superstrate 118, such that stripline transmission lines are formed with the signal lines 110 referenced to the ground planes 105 and 119. The ground planes 105 and 119 may be tied together to form a common ground potential. The length of the magnetic superstrate 119 may be shorter than the magnetic substrate 104 to allow access to transmission line segments 110 for bonding to transmission line bends 108 on the non-magnetic substrates 112.

The magnetic field sources 106a,b can disposed along the lengths of the transmission line 102 parallel to the segments 110a-e according to some embodiments of the present disclosure. In the example of FIG. 1A, the FSL 100 includes a first magnetic field source 106a disposed along one side of the transmission line structure 102 and thickest side of the substrate 104 and a second magnetic field source 106b disposed along an opposite side of the transmission line structure 102 and thinnest side of the substrate. The magnetic field sources 106a,b may be disposed such that they establish a DC magnetic field (or "bias field") that is perpendicular to the segments 110 during operation.

In some embodiments, the magnetic field sources 106a,b provide a constant bias magnetic field substantially parallel to an RF magnetic field in the magnetic material 104. In other embodiments, magnetic field sources 106a,b provide a constant bias magnetic field substantially perpendicular to an RF magnetic field in the magnetic material 104. In embodiments, the constant bias magnetic field can be some angle between perpendicular and parallel an RF magnetic field in the magnetic material 104.

Figure 2:
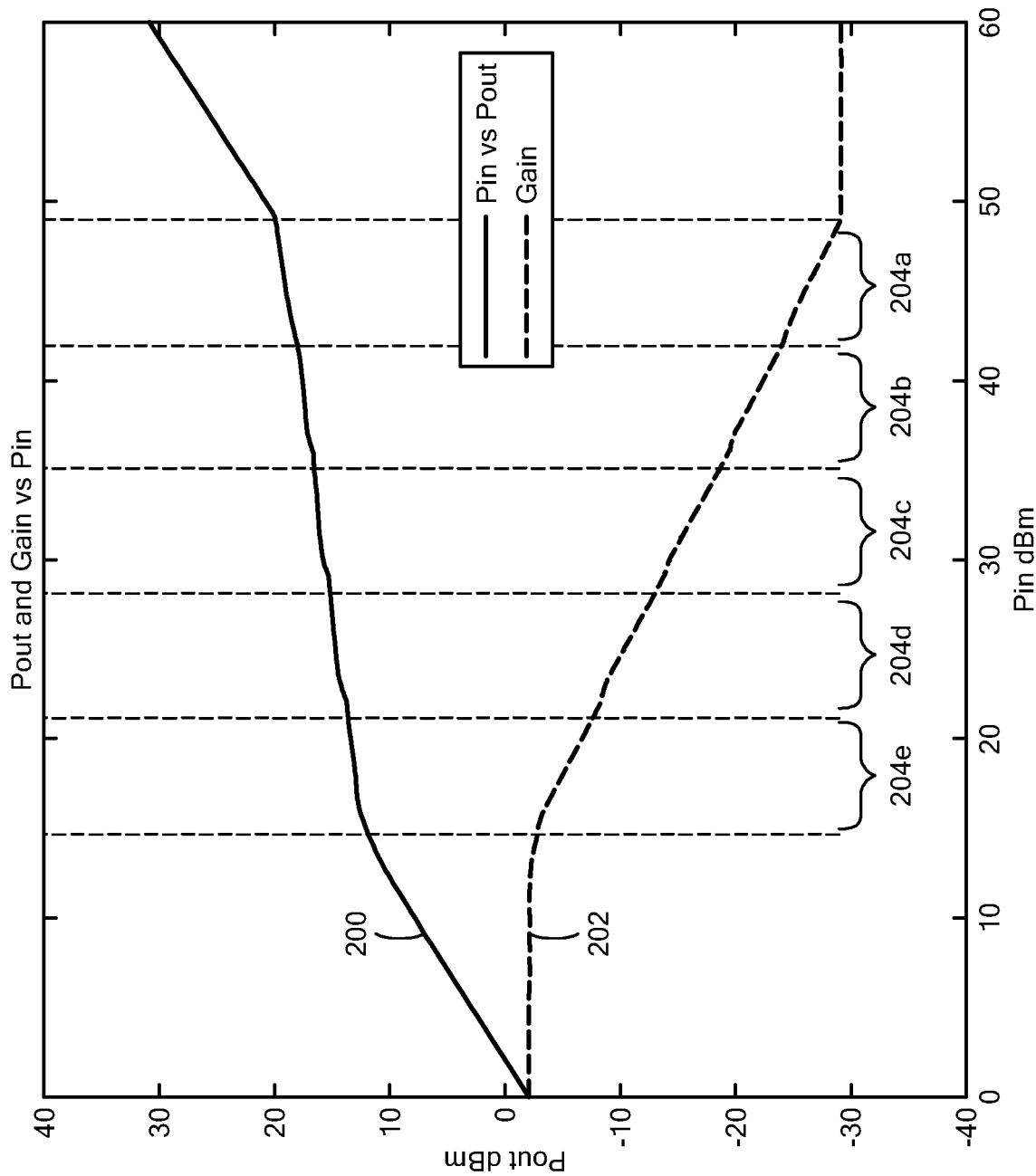
FIG. 2 is a waveform diagram showing response characteristics of an example transversely tapered FSL in accordance with example embodiments of the disclosure.

FIG. 2 shows limiting characteristics (gain versus input power 202 and output power versus input power 200) for an example transversely tapered FSL in accordance with illustrative embodiments of the disclosure. As can be seen, tapered segments, such as segments 110a-110e in FIG. 1A-1C, cover different ranges of power 204a, b, c, d, e. Once a first stage provides limiting, a next stage targets the next lower power range of the power levels and reduces the amount of YIG that may be overdriven.

In the illustrated embodiment, the FSL has a YIG thickness of 250 µm at the input side (T1) and 150 µm at the output side (T2). A length of the five segments 110 in total is 135 mm.

A first plot 200 shows output power $P_{out}$ versus input power $P_{in}$ where $P_{out}$ ranges from 0 to about 30 dBm on a scale of +/−40 dBm and $P_{in}$ ranges from 0 to 60 dBm. As can be seen, power is attenuated during an active power range until reaching saturation at about 50 dBm for $P_{in}$, which is saturation for the device. A second plot 202 shows the gain versus $P_{in}$. As can be seen, the gain 202 decreases in a generally linear-in-dB fashion as $P_{in}$ increases from about 15 dBm to about 50 dBm.

In embodiments, each of the transmission line segments provides attenuation for ranges 204a-e of input power $P_{in}$. In the illustrated embodiment, a first segment, such as the output segment 110e of FIG. 1A, which is the narrowest segment, corresponds to a first absorption in the input power range 204a from about 17 dBm to about 23 dBm. A second input power range 204b, which is adjacent to the first input power range 204a, corresponds to input power about 23 dBm to about 31 dBm, and so on until reaching saturation. The power range of a segment is inversely related to the width of the segment, where all widths are selected to provide a 50Ω characteristic impedance for the thickness of the magnetic substrate directly underneath the segment.

It is understood that any practical number of segments and input power ranges can be provided to meet the needs of a particular application.

Example embodiments of a FSL can provide advantages over known limiters. For example, transmission lines may be patterned transverse to YIG thickness taper with constant-width microstrip lines that may be easier to design and fabricate than other conventional FSL configurations. A transverse transmission line orientation allows a meandered FSL comprising a desired number of segments to provide overall limiting to meet the needs of a particular application. Also, the transverse structure allows a compact structure with a simple linear taper compared to a longitudinal structure of the same waveguide length.

Embodiments of transversely tapered frequency selective limiter (FSL) can comprise a metal ground plane on YIG bonded to a carrier substrate prior to YIG polishing on a taper. This may enable relatively simple fabrication processes that can reduce cost. A microstrip center conductor can be patterned after YIG polishing to taper thickness and can be aligned to accommodate the resulting polished thickness. This arrangement achieves low loss and strong limiting while also supporting wideband operation (e.g. 2-18 GHz).

In embodiments, a microstrip ground plane may not require alignment, and microstrip patterns can be aligned to YIG thickness after YIG fabrication so as to reduce required tolerances on absolute thickness during YIG polishing. Some embodiments may be compatible with surface-mount packaging with integrated bias magnets.

Stripline embodiments may provide enhanced limiting characteristics and enable narrower transmission lines to maintain 50 ohm impedance.

In some embodiments, the magnetic substrate material may comprise a ferrite material, such as yttrium iron garnet (YIG), single crystal yttrium iron garnet (SC-YIG), polycrystalline yttrium iron garnet (PC-YIG), hexagonal ferrite, calcium vanadium garnet (CVG), lithium ferrite, or nickel zinc ferrite, for example. The material supporting the bends of the transmission line can comprise any non-magnetic material, such as a ceramic material. Any suitable non-magnetic material can be used.

One skilled in the art will realize the concepts described herein may be embodied in other specific forms without departing from the spirit or essential characteristics thereof. The foregoing embodiments are therefore to be considered in all respects illustrative rather than limiting of the concepts described herein. Scope of the concepts is thus indicated by the appended claims, rather than by the foregoing description, and all changes that come within the meaning and range of equivalency of the claims are therefore intended to be embraced therein.

The invention claimed is:

1. A frequency selective limiter (FSL) comprising:
   a substrate comprising a magnetic material and having opposing first and second surfaces, wherein the substrate tapers from a first thickness to a second thickness which is less than the first thickness; and
   a transmission line positioned in relation to the first surface of the substrate, wherein the transmission line has segments and bends, wherein the segments are substantially parallel to each other, and wherein each segment traverses the substrate on a constant thickness of the substrate.

2. The FSL according to claim 1, wherein a first one of the segments is wider than a second one of the segments.

3. The FSL according to claim 1, wherein each of the segments has a constant width across the substrate.

4. The FSL according to claim 1, a first one of the segments having a largest width of the segments traverses the substrate at a location where the thickness of the substrate is greater than for any other segment.

5. The FSL according to claim 1, wherein a thickness of each adjacent segment decreases as the thickness of the substrate decreases.

6. The FSL according to claim 1, wherein the substrate comprises an yttrium iron garnet (YIG) material.

7. The FSL according to claim 1, further including a non-magnetic substrate to support the bends of the transmission line.

8. The FSL according to claim 1, wherein the transmission line comprises a microstrip configuration.

9. The FSL according to claim 1, wherein the transmission line comprises a stripline configuration.

10. The FSL according to claim 1, wherein different ones of the segments provide different ranges of power attenuation.

11. The FSL according to claim 1, further including magnetic field sources to provide a constant bias magnetic field substantially parallel to an RF magnetic field in the magnetic material.

12. The FSL according to claim 1, further including magnetic field sources to provide a constant bias magnetic field substantially perpendicular to an RF magnetic field in the magnetic material.

13. A method for providing a frequency selective limiter (FSL), comprising:
   employing a substrate comprising a magnetic material and having opposing first and second surfaces, wherein the substrate tapers from a first thickness to a second thickness which is less than the first thickness; and
   positioning a transmission line in relation to the first surface of the substrate, wherein the transmission line has segments and bends, wherein the segments are substantially parallel to each other, and wherein each segment traverses the substrate on a constant thickness of the substrate.

14. The method according to claim 13, wherein a first one of the segments is wider than a second one of the segments.

15. The method according to claim 13, wherein each of the segments has a constant width across the substrate.

16. The method according to claim 13, wherein a first one of the segments having a largest width of the segments traverses the substrate at a location where the thickness of the substrate is greater than for any other segment.

17. The method according to claim 13, wherein a thickness of each adjacent segment decreases as the thickness of the substrate decreases.

18. The method according to claim 13, wherein the substrate comprises an yttrium iron garnet (YIG) material.

19. The method according to claim 13, further including employing a non-magnetic substrate to support the bends of the transmission line.

20. The method according to claim 13, wherein different ones of the segments provide different ranges of power attenuation.

* * * * *